United States Patent
Gal

(10) Patent No.: US 9,831,105 B2
(45) Date of Patent: Nov. 28, 2017

(54) METHOD FOR MOULDING AND SURFACE PROCESSING ELECTRONIC COMPONENTS AND ELECTRONIC COMPONENT PRODUCED WITH THIS METHOD

(71) Applicant: Besi Netherlands B.V., Duiven (NL)

(72) Inventor: Wilhelmus Gerardus Jozef Gal, Kilder (NL)

(73) Assignee: Besi Netherlands B.V., Duiven (NL)

( * ) Notice: Subject to any disclaimer, the term of this patent is extended or adjusted under 35 U.S.C. 154(b) by 0 days.

(21) Appl. No.: 15/024,619

(22) PCT Filed: Sep. 26, 2014

(86) PCT No.: PCT/NL2014/050658
§ 371 (c)(1),
(2) Date: Mar. 24, 2016

(87) PCT Pub. No.: WO2015/047089
PCT Pub. Date: Apr. 2, 2015

(65) Prior Publication Data
US 2016/0240397 A1    Aug. 18, 2016

(30) Foreign Application Priority Data

Sep. 26, 2013   (NL) ..................... 2011512

(51) Int. Cl.
*H01L 21/00* (2006.01)
*H01L 21/56* (2006.01)
(Continued)

(52) U.S. Cl.
CPC ...... *H01L 21/566* (2013.01); *B29C 45/14754* (2013.01); *H01L 21/561* (2013.01);
(Continued)

(58) Field of Classification Search
None
See application file for complete search history.

(56) References Cited

U.S. PATENT DOCUMENTS 5,955,115 A * 9/1999 Bolanos ............ B29C 45/14655
                                                              257/E21.504
5,998,243 A * 12/1999 Odashima ......... B29C 45/14655
                                                              257/E21.503

(Continued)

FOREIGN PATENT DOCUMENTS

CN    102254868 A    11/2011
EP    1085566 A1    3/2001
(Continued)

OTHER PUBLICATIONS

Resintech, Technical Data Sheet, "RT350 Low Viscosity Highly Flexible Epoxy Resin System", Apr. 2005, one page, Issue 5.
(Continued)

*Primary Examiner* — Evren Seven
(74) *Attorney, Agent, or Firm* — The Webb Law Firm

(57) ABSTRACT

The invention relates to a method for moulding and surface processing electronic components wherein a grid of electronic components is attached on a carrier; subsequently foil is placed against the side of the electronic components opposite to the carrier and are the electronic components partially encapsulated. After moulding the foil is removed from the electronic components and a free side of the components is surface processed. The invention also relates to a partial encapsulated electronic component as produced with such a method.

12 Claims, 4 Drawing Sheets

(51) Int. Cl.
*H01L 21/683* (2006.01)
*H01L 23/31* (2006.01)
*H01L 23/00* (2006.01)
*B29C 45/14* (2006.01)
*B29C 33/68* (2006.01)

(52) U.S. Cl.
CPC .......... *H01L 21/565* (2013.01); *H01L 21/568* (2013.01); *H01L 21/6835* (2013.01); *H01L 23/3185* (2013.01); *H01L 24/19* (2013.01); *H01L 24/96* (2013.01); *B29C 33/68* (2013.01); *B29C 45/14655* (2013.01); *B29C 2045/1477* (2013.01); *B29C 2045/14663* (2013.01); *H01L 2224/04105* (2013.01); *H01L 2924/18162* (2013.01)

(56) References Cited

U.S. PATENT DOCUMENTS

| | | | |
|---|---|---|---|
| 2004/0017002 A1 | 1/2004 | Siegel et al. | |
| 2004/0063234 A1 | 4/2004 | Takase et al. | |
| 2004/0110323 A1 | 6/2004 | Becker et al. | |
| 2004/0227258 A1* | 11/2004 | Nakatani | H01L 23/49805 257/787 |
| 2005/0145328 A1 | 7/2005 | Lim et al. | |
| 2006/0014328 A1 | 1/2006 | Shimonaka et al. | |
| 2007/0205513 A1 | 9/2007 | Brunnbauer et al. | |
| 2008/0038873 A1 | 2/2008 | Tanida | |
| 2008/0197376 A1* | 8/2008 | Bert | B29C 45/0001 257/99 |
| 2009/0146301 A1* | 6/2009 | Shimizu | B29C 43/18 257/738 |
| 2010/0148332 A1* | 6/2010 | Kajiki | H01L 21/565 257/678 |
| 2011/0151623 A1 | 6/2011 | Takahashi | |
| 2011/0285007 A1* | 11/2011 | Chi | H01L 24/96 257/686 |
| 2011/0316156 A1* | 12/2011 | Pagaila | H01L 21/561 257/738 |
| 2012/0049344 A1* | 3/2012 | Pagaila | H01L 21/56 257/737 |
| 2012/0148820 A1* | 6/2012 | Okuya | B29C 33/68 428/220 |
| 2012/0326306 A1* | 12/2012 | Lee | H01L 25/16 257/738 |
| 2013/0280826 A1* | 10/2013 | Scanlan | H01L 23/544 438/15 |
| 2014/0070391 A1* | 3/2014 | Rogren | H01L 21/568 257/676 |
| 2014/0353836 A1* | 12/2014 | O'Sullivan | H01L 21/56 257/773 |

FOREIGN PATENT DOCUMENTS

| | | |
|---|---|---|
| EP | 1333480 A2 | 8/2003 |
| JP | 2012167177 A | 9/2012 |

OTHER PUBLICATIONS

International Search Report for International Application No. PCT/NL2014/050658.

* cited by examiner

METHOD FOR MOULDING AND SURFACE PROCESSING ELECTRONIC COMPONENTS AND ELECTRONIC COMPONENT PRODUCED WITH THIS METHOD

CROSS-REFERENCE TO RELATED APPLICATIONS

This application is the United States national phase of International Application No. PCT/NL2014/050658 filed Sep. 26, 2014, and claims priority to Dutch Patent Application No. 2011512 filed Sep. 26, 2013, the disclosures of which are hereby incorporated in their entirety by reference.

BACKGROUND OF THE INVENTION

Field of the Invention

The invention relates to a method for moulding and surface processing electronic components by successive processing steps. These processing steps comprise —among others —A) the attachment of a grid of electronic components on a carrier; B) the placing of a foil against the side of the electronic components opposite to the carrier; C) the enclosure of the foil covered electronic components on the carrier with a mould cavity; D) the feeding to the mould cavity of an encapsulating material; E) the at least partial hardening of the encapsulating material fed to the mould cavity; and F) removing from the mould cavity the partial encapsulated electronic components attached to the carrier.

Description Of Related Art

During the encapsulation of electronic components mounted on a carrier, and more particularly the encapsulation of semiconductor circuits (chips)/integrated circuits (IC's), use is usually made according to the prior art of encapsulating presses provided with two mould halves, into at least one of which is recessed one or plural mould cavities. After placing the carrier with the electronic components for encapsulating between the mould halves, the mould halves may be moved toward each other, e.g. such that they clamp the carrier. A, normally heated, liquid encapsulating material may then be fed to the mould cavities, usually by means of transfer moulding. As an alternative it is also possible to bring the encapsulating material as a granulate in the mould cavity in which case the components to be moulded are pressed into the moulding material; such compression moulding process is an alternative for transfer moulding. Applied as encapsulating material is epoxy (also referred to as resin) which is generally provided with filler material. After at least partial (chemical) curing of the encapsulating material in the mould cavity/cavities, the carrier with encapsulated electronic components is taken out of the encapsulating press. And the encapsulated products are separated from each other during further processing. The use of foil is to screen or cover a part of the electronic components to be covered with the foil and thus to prevent a part of electronic component to be covered by the encapsulating material. The partial covered product (not over moulded products are also referred to as "bare die" products) can be used in various applications; like for instance various types of sensor components or heat dissipating components. This method of moulding is practised on large industrial scale and enables well controlled moulding of partially uncovered electronic components. A problem during the subsequent processing of the partial moulded and separated electronic components is that the accuracy of the dimensions of the moulded product is not fully controllable, among others due to the heating and cooling that takes place during the moulding process.

The present invention has for its object to provide an alternative method and device with which the advantages of the prior art method of partial moulding of electronic components are maintained but that enable better/more accurate processing of the partial moulded electronic components in subsequent processing steps.

SUMMARY OF THE INVENTION

The invention provides for this purpose a method for moulding and surface processing electronic components by the successive processing steps of: A) attaching a grid of electronic components on a carrier; B) placing a foil against the side of the electronic components opposite to the carrier; C) enclosing the foil covert electronic components on the carrier with a mould cavity; D) feeding to the mould cavity an encapsulating material; E) at least partial hardening of the encapsulating material fed to the mould cavity; F) removing from the mould cavity the partial encapsulated electronic components attached to the carrier; G) removing the foil from the partial encapsulated electronic components attached to the carrier; H) providing at least one surface influencing process to the free side of the components attached to the carrier; and I) loosening the partial encapsulated and surface processed electronic components from the carrier. One of the advantages of the method according the present invention is that due to the reason that after removing the foil from the partial encapsulated electronic components attached to the carrier directly the at least one surface influencing process is provided to the free side of the components attached to the carrier the partial moulded components will not (or at least less than according the prior art methods) deform (shrink, bend, warp etc.) before the surface influencing process is provided. In this respect the word "directly" should be understood as that the partial uncovered components are not de-attached from the carrier before the surface influencing process is provided. As the partial uncovered electronic components are still attached to the carrier during the surface influencing process the carrier will retain the electronic components and the cured moulding material (substantially) in it moulded shape and thus the shape and dimensions of the partial moulded electronic components and the adjoining cured moulding material product is well under control. The surface influencing process(es) can thus also be performed with more control leading to a higher precision of the processed products. A further advantage is that the carrier as a product carrier can be used during handling to and in one ore more surface influencing process stations. Only after the surface influencing process(es) took place the partial encapsulated and surface processed electronic components are loosened from the carrier.

The foil as used in the method according the invention is a foil covering the electronic components on the side that is turned away from the carrier and is also referred to as a "anti flash release foil" or "release foil" and keeps the turned sides of the electronic components that are turned away from the carrier, as the name already indicates, free of moulding material ("flash"). In the method according the present invention the foil referred to is to be understood as the electronic components covering foil (so to say the "release foil"). Besides the use of this obligatory ("release") foil it is also possible to use additionally an other type of foil. As for the attachment of a grid of electronic components on a carrier according step A) and the de-attachment of the components according step I) use may be made of an attachment layer with temperature dependent properties.

Such an attachment layer (in practise also a foil that is referred to as "attach foil" or "sticky foil") preferably has adhesive properties at moulding temperature but looses it's adhesive properties at some level above moulding temperature. Such temperature sensitivity can be used to attach the grid of electronic components on the carrier during processing step A) at a temperature level below moulding temperature and allows the loosening of the partial encapsulated and surface processed electronic components from the carrier during process step I) by heating the attachment layer for that reason to above the temperature where the attachment layer looses it's adhesive properties. The heating of the attachment layer may for instance be initiated by conductive heating or (UV) radiation or an alternative method of heating. The choice in type of heating may be made dependent on the type of carrier (material) used. It is furthermore important that there are no remains of the attachment layer on the electronic components after they are loosened. The use of an "attach foil" between the carrier and the electronic components may be combined with the obligatory use of the ("release") foil on the side of the electronic components turned away from the carrier.

After the loosing of the partial encapsulated and surface processed electronic components from the carrier according processing step I) the partial encapsulated and surface processed electronic components may be separated. At the moment of separation then already the required accuracy in the surface influencing process(es) is embedded in the electronic components.

In an embodiment of the method during processing step A) the grid of electronic components may be assembled as a silicon wafer. Moulding of the electronic components can thus take place without separation before the moulding. This is also supportive in to realise an enhance control on the product dimensions and shape, and thus to an enhanced product quality.

The grid of electronic components may during processing step A) be attached to a flat carrier plate, preferably a flat metal plate. The metal plate may have such dimensions that it is stable in shape independent on the presence and condition of the moulding material. In ideal circumstances curing of the moulding material on the flat carrier plate is not having a significant effect on the shape (and size) of the carrier plate. Positive results have been realised in using a circular metal carrier plate with oblate sides to enable the carriers to be placed in slotted cassettes. As an alternative also flat carrier plates with other shapes may be used like for instance rectangular carrier plates. A typical thickness for flat carrier plates made out of stainless steel is 1-2 mm, however the carrier plates may also be made out of other materials like copper, aluminium, ceramic or glass.

As there is a tendency to use smaller components the encapsulating material fed to the mould cavity during processing step D) has in an embodiment where the encapsulating material is fed as a liquid into the mould via transfer moulding a viscosity of a liquid like water, oil or honey, e.g. a viscosity 1-5 Pa.s. ($=2 \cdot 10^3$-$5 \cdot 10^3$ mPa.s.). Especially the liquid encapsulating material may be fed to the mould cavity by transfer moulding but as alternatives also (pin point) injection moulding of other moulding material supply methods may be used.

The removal from the mould cavity of the partial encapsulated electronic components attached to the carrier (according processing step F) may simultaneously be performed with the removal of the foil from the partial encapsulated electronic components attached to the carrier (according processing step G). By combining these two processing steps the cycle time can be limited.

For easier removal of the foil from the electronic components (according processing step G) the foil may be heated. Not only the removal process can thus be facilitated but also the chance of diminished product quality due to inadequate foil removal can so be limited.

The at least one surface influencing process provided to the free side of the electronic components according processing step H) may be selected from the group of: lithography, etching, illuminating, imprinting, laser activation and plating. Typical surface influencing processes that may be performed on the free side of the partial moulded electronic components (as well as to the moulding material bordering to the electronic components) is that electric contact wiring and/or points of contact may be provided (e.g. referred to as "fan out") by lithography type of processes. The surface influencing process provided to the free side of the components according processing step H) may thus, as a non-limitative example, be a process applying electric conductive connections from the electronic components to the surface of the encapsulating material. The accuracy of positioning of elements like wiring and/or points of contact is very important in the application of such "surface treated" electronic products.

The present invention enables a higher accuracy in physical product variables and thus in better process control during subsequent use of the partial encapsulated electronic component as produced with the method disclosed above.

BRIEF DESCRIPTION OF THE DRAWINGS

The present invention will be further elucidated on the basis of the non-limitative exemplary embodiments shown in the following figures. Herein shows.

DETAILED DESCRIPTION OF THE INVENTION

Figure 1A:
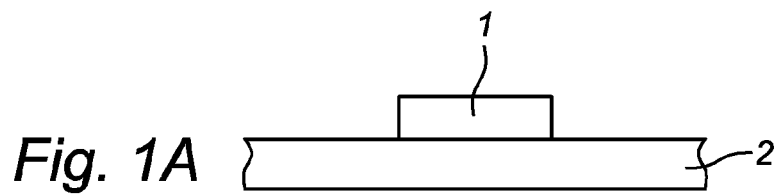
FIGS. 1A-1F various schematic represented electronic components in various stages of the method according the present invention.
Figure 1B:
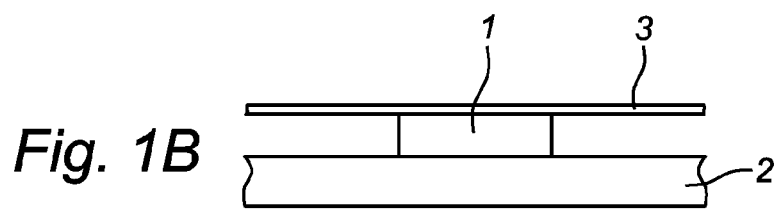
Figure 1C:
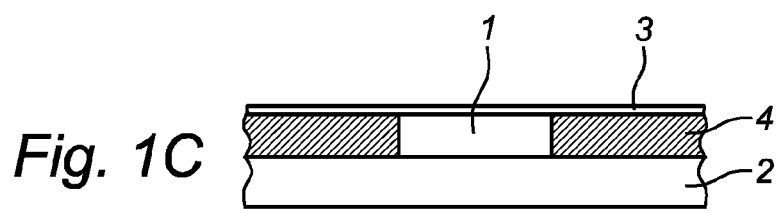
Figure 1D:
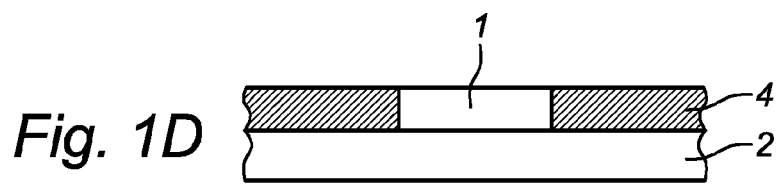
Figure 1E:
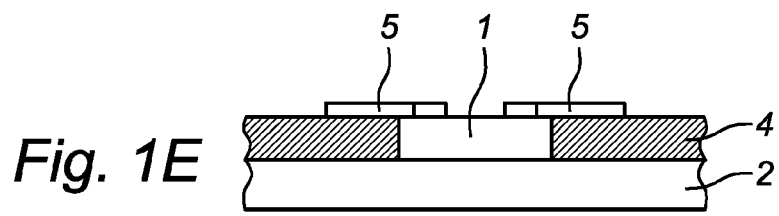
Figure 1F:
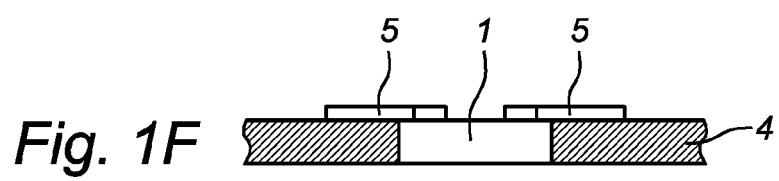

FIG. 1A shows an electronic component 1 (e.g. and Integrated Circuit, IC) that is placed on a carrier 2. In FIG. 1B a foil 3 (e.g. an "anti flash release foil") is placed against the side of the electronic component 1 that is turned away from the carrier 2. In FIG. 1C is the electronic component 1 shown after a moulding material 4 has been fed in between the carrier 2 and the foil 3 such that encapsulating material is provided only between the foil 3 and the carrier 2. In FIG. 1D the partial moulded electronic component 1 is freed from the foil 3 that covered the side of the electronic component 1 that is turned away from the carrier 2 to keep the electronic component 1 on one side free, also referred to as the free side, from moulding material 4. In figure 1E is shown that on the side of the electronic component 1 that is turned away from the carrier 2 electric contact wiring 5 is applied. In FIG. 1F the electronic component 1 is shown as released product. Not shown in these FIGS. 1A-1E is that there may also be an attachment layer present (e.g. an "attach foil" or "sticky foil") between on one side the carrier 2 and on the other side the electronic component 1 and the moulding material 4. E.g. by heating the carrier as shown in figure 1E the electronic component 1 and the moulding material 4 may be loosened from the carrier 2.

Figure 2A:
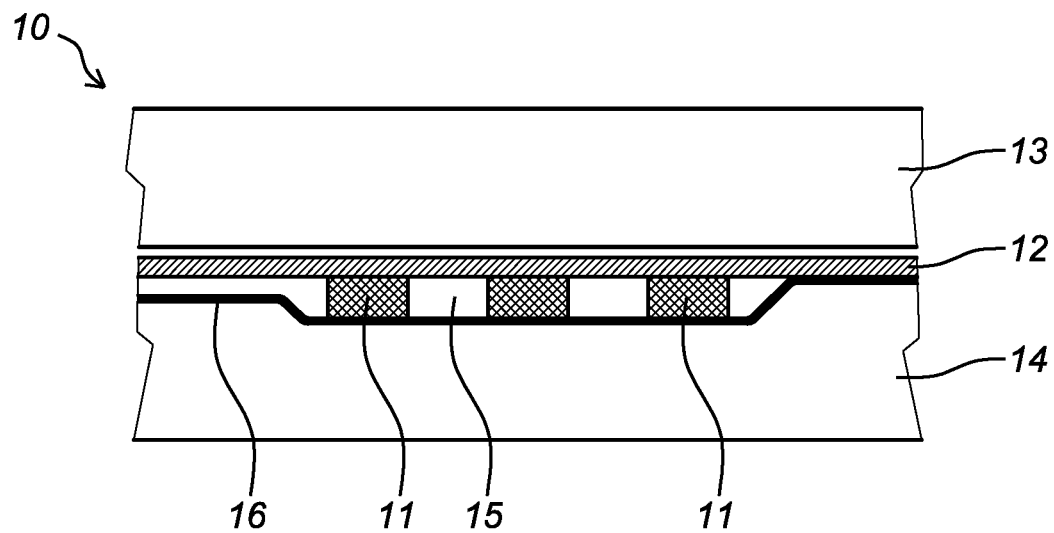
FIGS. 2A and 2B two cross sections through a part of a mould for encapsulating electronic components.

FIG. 2A shows a cross section through a part of a mould 10 for encapsulating electronic components 11 as part of the method of the present invention. The electronic components 11 are attached to a carrier plate 12 which carrier plate is clamped between an upper mould part 13 and a lower mould part 14. In the lower mould part a mould cavity 15 is left open, which mould cavity 15 holds the electronic components 11. Between the electronic components 11 and the mould cavity 15 a foil 16 is placed so that the sides of the electronic components 11 that are turned away from the carrier plate 12 are protected by this foil 16. The figure also shows a foil 16 that is also kept free in the lower mould part 14 and that connects to the mould cavity 15 to feed a moulding material (not shown in FIG. 2A) to the mould cavity 15.

Figure 2B:
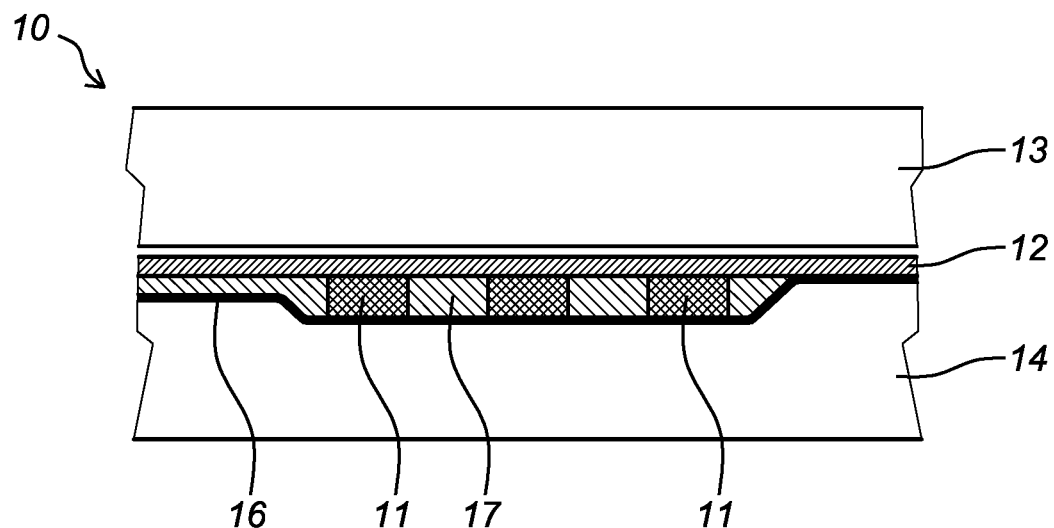

FIG. 2B shows a cross section through a part of a mould 10 for encapsulating electronic components 11 as shown in FIG. 2A but now in the situation that a moulding material 17 is fed as a liquid into the mould cavity 15. After at least partial curing (hardening) of the moulding material 17 the upper mould part 13 and a lower mould part 14 can be moved apart and the carrier plate 12 with partial moulded electronic components 11 can be taken out of the mould 10. The foil 16 may either be removed from the mould 10 with the removal of the carrier plate 12 with partial moulded electronic components 11 or, as an alternative, can remain behind in the lower mould part 14 with the removal of the carrier plate 12 with partial moulded electronic components 11.

Figure 3A:
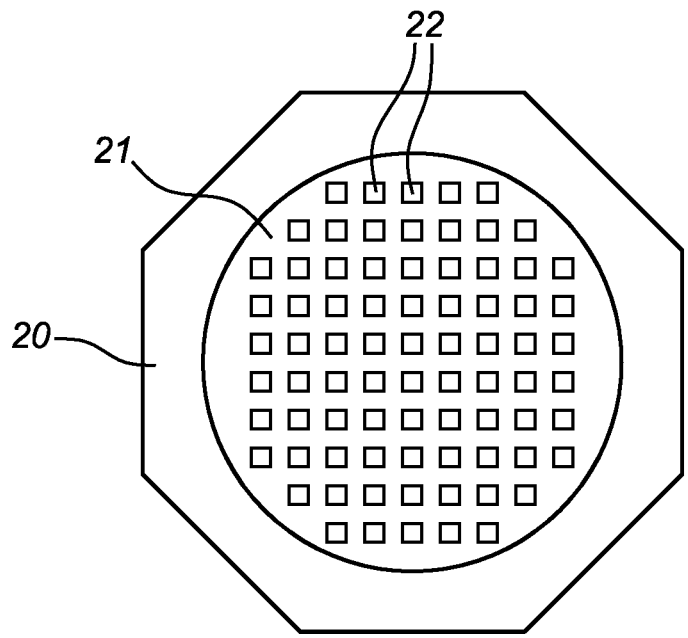
FIGS. 3A and 3B two top views of carriers with electronic components.
Figure 3B:
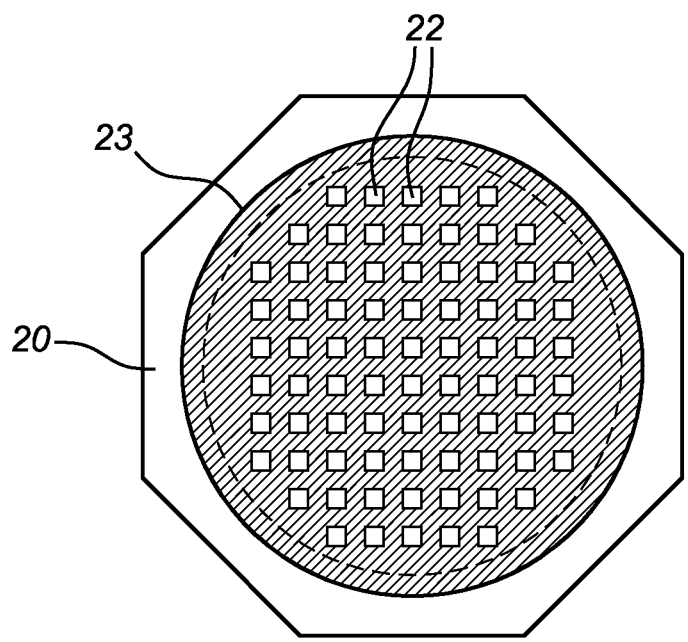

FIG. 3A shows a top view of a carrier plate 20 holding a wafer 21 with electronic components 22. In FIG. 3B the carrier plate 20 is shown after a moulding compound 23 has been added to partially cover the electronic components 22. The sides of the electronic components 22 that are turned away from the carrier plate 20 are kept free of the moulding compound 23.

Figure 4A:
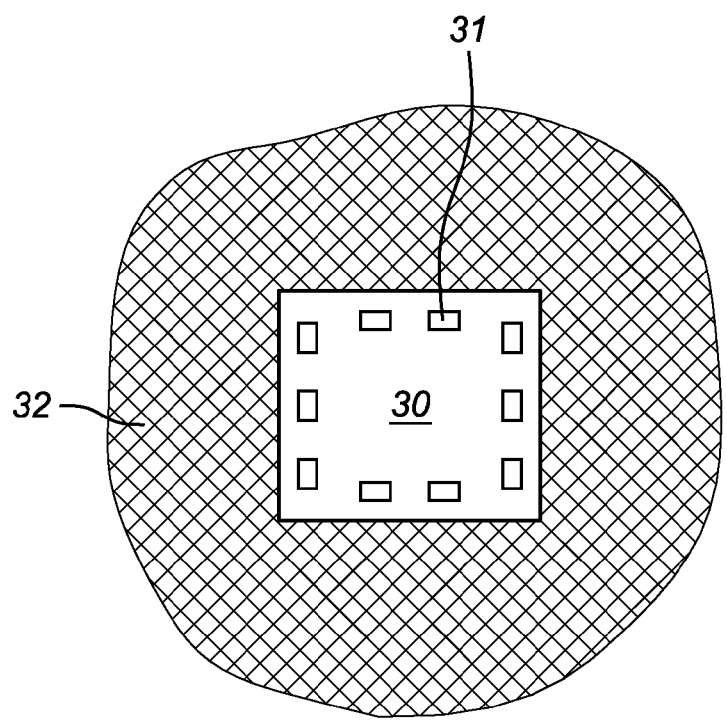
FIGS. 4A and 4B two top views of a partially moulded electronic component before and after a surface influencing process took place.
Figure 4B:
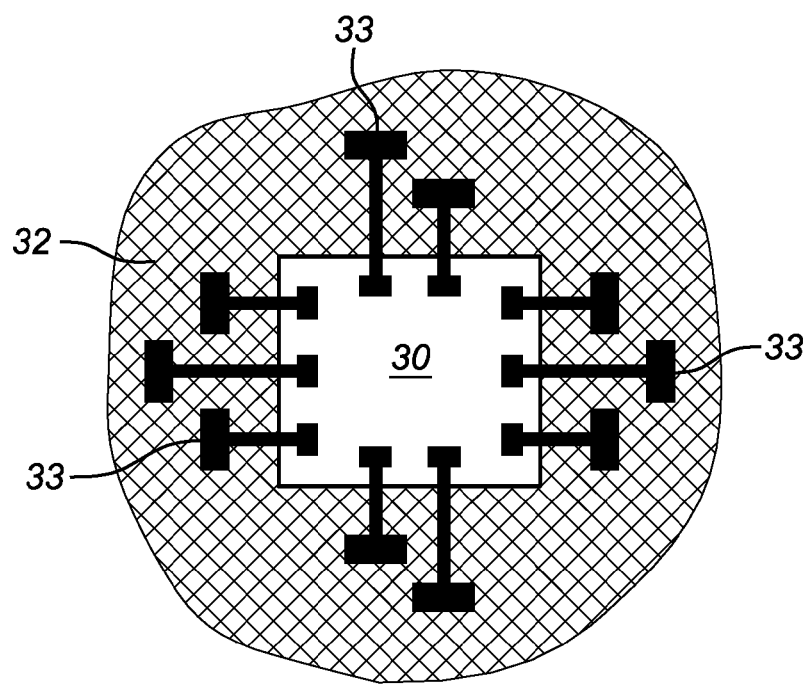

FIG. 4A shows a top view of an electronic component 30 with contacts 31 that is partially covered by moulding material 32 as elucidated in relation to the previous figures. In FIG. 4B the electronic component 30 with contacts 31 as shown in FIG. 4A is now provided with contact wiring 33, which contact wiring 33 is placed on top of the electronic component 30 and the moulding material 32 surrounding the electronic component 30. The contact wiring 33 is applied with a surface influencing process that took place while the electronic component 30 and the moulding material 32 were still attached to a carrier plate (which is not visible in FIGS. 4A and 4B).

The invention claimed is:

1. A method for moulding and surface processing electronic components by the successive processing steps of:
    A) attaching a grid of electronic components on a carrier;
    B) placing a foil against the side of the electronic components opposite to the carrier to cover the electronic components;
    C) enclosing the foil covered electronic components on the carrier within a cavity of a mould;
    D) feeding to the mould cavity an encapsulating material only between the foil and the carrier;
    E) at least partially hardening of the encapsulating material fed to the mould cavity;
    F) removing from the mould cavity the partially encapsulated electronic components attached to the carrier;
    G) removing the foil from the partially encapsulated electronic components attached to the carrier to expose a free side of the components attached to the carrier;
    H) providing at least one surface influencing process to the free side of the components attached to the carrier; and
    I) removing the partially encapsulated and surface processed electronic components from the carrier,
    wherein the encapsulating material is fed to the mould cavity during processing step D) by transfer moulding.

2. The method as claimed in claim 1, wherein after processing step I) the partial encapsulated and surface processed electronic components are separated.

3. The method as claimed in claim 1, wherein during processing step A) the grid of electronic components is assembled from a silicon wafer.

4. The method as claimed in claim 1, wherein the grid of electronic components attached during the processing step A) is attached to a flat carrier plate.

5. The method as claimed in claim 1, wherein the encapsulating material fed to the mould cavity during processing step D) as a liquid and has a viscosity of 1-5 Pa.s.

6. The method as claimed in claim 1, wherein processing step F) of removing from the mould cavity the partial encapsulated electronic components attached to the carrier is simultaneously performed with according processing step G) the removal of the foil from the partial encapsulated electronic components attached to the carrier.

7. The method as claimed in claim 1, wherein during processing step G) the foil is heated to remove the foil from the electronic components.

8. The method as claimed in claim 1, wherein at least one surface influencing process provided to the free side of the components according processing step H) is selected from the group of: lithography, etching, illuminating imprinting, laser activation, plating.

9. The method as claimed in claim 1, wherein at least one surface influencing process provided to the free side of the components according processing step H) is a process applying electric conductive connections from the electronic components to the surface of the encapsulating material.

10. A partial encapsulated electronic component as produced with the method of claim 1.

11. The method as claimed in claim 4, wherein the grid of electronic components attached during processing step A) is attached to a flat metal plate.

12. The method as claimed in claim 1, wherein the carrier is made of glass.

* * * * *